United States Patent [19]
Ito et al.

[11] Patent Number: 5,204,166
[45] Date of Patent: Apr. 20, 1993

[54] THICK FILM RESISTOR COMPOSITION, HYBRID IC USING THE COMPOSITION, AND PROCESS FOR PRODUCING THE HYBRID IC

[75] Inventors: Osamu Ito, Hitachi; Tadamichi Asai, Ibaraki; Toshio Ogawa, Katsuta; Noritaka Kamimura, Hitachi; Yoshishige Endou, Tsuchiura; Takao Kobayashi, Hitachi; Hiromi Isomae, Nakaminato; Masaki Kamiakutsu, Katsuta; Michio Otani, Chiba; Katsuo Ebisawa, Ibaraki, all of Japan

[73] Assignees: Hitachi, Ltd.; Hitachi Chemical Company, Ltd., both of Tokyo, Japan

[21] Appl. No.: 659,682

[22] Filed: Feb. 25, 1991

[30] Foreign Application Priority Data

Feb. 23, 1990 [JP] Japan ................................ 2-043688

[51] Int. Cl.$^5$ .............................................. B32B 9/00
[52] U.S. Cl. .................................... 428/209; 428/323; 428/328; 428/426; 428/432; 428/688; 428/901; 252/518; 252/520; 252/521

[58] Field of Search ............... 428/209, 323, 328, 426, 428/432, 688, 901; 252/518, 520, 521

[56] References Cited

U.S. PATENT DOCUMENTS 4,168,344  9/1979  Shapiro et al. ...................... 428/328
4,695,504  9/1987  Watanabe et al. ................... 428/209

Primary Examiner—Patrick J. Ryan
Assistant Examiner—Cathy K. Lee
Attorney, Agent, or Firm—Antonelli, Terry, Stout & Kraus

[57] ABSTRACT

The present invention relates to a thick film resistor material which is suitable especially for thick film hybrid IC having conductor, resistor, semiconductor element and the like in which Cu is used as the conductor and furthermore, a thick film resistor composition which can be fired in a reducing atmosphere. The present invention further relates to a thick film hybrid IC using the thick film resistor composition as a resistor and a method for making it.

23 Claims, 2 Drawing Sheets

THICK FILM RESISTOR COMPOSITION, HYBRID IC USING THE COMPOSITION, AND PROCESS FOR PRODUCING THE HYBRID IC

BACKGROUND OF THE INVENTION

Field of the Invention

The present invention relates to a thick film resistor composition suitable for Cu conductors used for thick film hybrid IC and the like, a thick film hybrid IC to which said composition is applied, and a process for producing the hybrid IC.

Description of the Related Art

The thick film hybrid IC comprises a substrate on which a conductor circuit, a thick film resistor and a dielectric are formed by printing and firing methods and on which a semiconductor integrated circuit element and the like are provided. The substrate used herein means an insulating substrate comprising SiC or the like to which $Al_2O_3$, AlN, and BeO are added. The thick film resistor used herein means a resistor circuit formed on the substrate by thick film printing techniques. In the thick film hybrid IC, generally, Ag-Pd materials are used for the conductor circuits and $RuO_2$-glass materials for the resistors. However, the Ag-Pd materials have the defects that they have a high impedance and are apt to cause electromigration and these are problems in using the materials for the thick film hybrid IC. Therefore, Cu materials which are lower than the Ag-Pd materials in impedance and cause no electromigration are noticed as materials for the conductor circuits, but Cu is readily oxidized and can be fired only in a reducing atmosphere such as nitrogen gas.

On the other hand, use of the above-mentioned $RuO_2$-glass materials as resistors has the problem that $RuO_2$ is reduced in nitrogen gas. Now, $LaB_6$ is known as resistor materials which can be used even in a reducing atmosphere for the thick film hybrid IC where the Cu materials are used as conductor circuit [Japanese Patent Kokai (Laid-Open) No. 55-30889]. However, at present, $LaB_6$ can only cover at most 10 k $\Omega/\square$ in resistivity.

The range of resistivity required for the resistor materials used for the thick film hybrid IC is 10 $\Omega/\square$ – 1 M $\Omega/\square$. Therefore, in order to cover the above range of resistivity of the thick film hybrid IC which is fired in a reducing atmosphere, $LaB_6$-glass materials are used to cover about 10 $\Omega/\square$ – 1 k $\Omega/\square$ and $SnO_2$-glass materials are sued to cover about 10 k $\Omega/\square$ – 1 Mk $\Omega/\square$. Resistor materials of a high performance which is comparable to that of $RuO_2$-glass materials have not yet been found and hence, the $RuO_2$-glass materials are used in combination for the conductor circuits of Ag-Pd.

Metal borides can be considered as a conductive component of the resistor combined with Cu conductor circuits.

As the metal borides, the above-mentioned $LaB_6$-glass material is used, but this material is unstable in TCR (temperature coefficient of resistance) and has problems in being used as a resistor material of the hybrid IC and the like.

For improving the TCR of the above $LaB_6$-glass resistor materials, it has been proposed to add a material such as TiO, $Ti_3O_5$, $Ti_2O_3$, NbO, C, Si, Ge, or SiC which is unreactive with $LaB_6$ as a TCR regulator [Japanese Patent Kokai (Laid-Open) No. 55-29199].

However, according to researches conducted by the inventors, the above materials are unsatisfactory for controlling the TCR of the resistors having the above-mentioned range of resistivity (10 $\Omega/\square$ – 1 M $\Omega/\square$) required for the resistor materials of the thick film hybrid IC, especially of a low resistivity region (10 $\Omega/\square$ – 1 k $\Omega/\square$) to a given range.

SUMMARY OF THE INVENTION

The object of the present invention is to provide a thick film resistor composition which contains a metal boride such as $LaB_6$, gives a TCR within the range of ±100 ppm/°C. to the resistor and provides the range of resistivity required by the thick film hybrid IC, and to provide the thick film hybrid IC in which said composition is used.

In accordance with the present invention, for attaining the above object, in the case where the thick film resistor composition contains the metal boride, glass and an organic vehicle, metallic Co or crystalline Co oxide is contained therein in an amount of 0.1-10 parts by weight in terms of Co per 100 parts by weight of the mixture of the metal boride and the glass, and in the case where the hybrid IC having a Cu conductor circuit and a thick film resistor formed in contact with said conductor circuit, said thick film resistor comprises a sintered body of a composition containing the metal boride, glass and metallic Co or crystalline Co oxide, said metallic Co or crystalline Co oxide being contained in the composition in an amount necessary for said sintered body to have a temperature coefficient of resistance (TCR) within the range of ±100 ppm/°C.

DETAILED DESCRIPTION OF PREFERRED EMBODIMENTS

Figure 1:
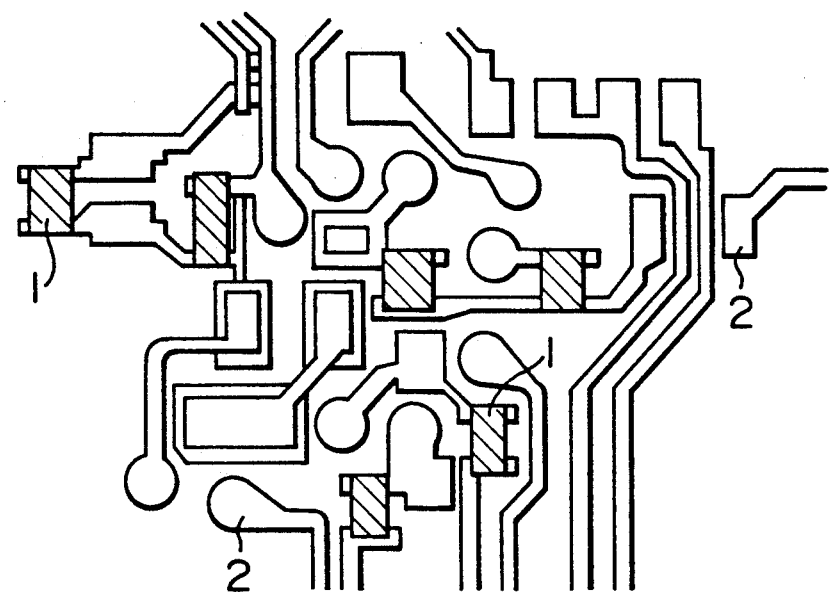
FIG. 1 shows a partial view of a circuit pattern of a hybrid IC made from a resistor matrix circuit.

In the present invention, the metal boride is a boride of a metal selected from rare earth elements, Group IV elements, Group V elements, Group VI elements and Group VIII elements. Typical examples thereof are $LaB_6$, $TiB_2$, $ZrB_2$, $TaB_2$, MoB, WB, FeB, NiB, $HfB_2$, and $NbB_2$.

The glass used herein has no special limitation as far as it is non-reducible glasses which are not reduced even in a reducing atmosphere. However, since the glasses undergo firing at about 900° C., they are reduced in the firing step unless they have a softening point of 800° C. or higher. Especially, glasses having a softening point of 500°-600° C. have the properties of being easily reduced in a reducing atmosphere. Therefore, for example, borosilicate glasses are preferred in the present invention.

As the organic vehicles, preferred are those which are decomposable in a non-reducing atmosphere and, for example, the vehicles are obtained by dissolving an acrylic resin in butylcarbitol acetate, ethyl cellulose or the like. The organic vehicles are required to have a range of viscosity which varies depending upon printing characteristics in paste-printing, and in the present invention, good printing characteristics can be obtained when the amount of the acrylic resin added is within the range of 25-35 g per 100 cc of butylcarbitol acetate.

The amount of the metallic Co or crystalline Co oxide is preferably in the range of 0.1-10 parts by weight in terms of Co per 100 parts by weight of the mixture of the metal boride and the glass.

The range is more preferably 0.1-5 parts by weight, which is more effective for decreasing the temperature coefficient of resistance (TCR).

The blending ratio of the metal boride and the glass varies depending upon the range of resistivity and etc. of the desired resistor and, in the present invention, they are blended so that the amount of the glass is in the range of 40-95 vol %. If the amount of the glass exceeds 95 vol %, the effect of addition of the metal boride decreases and if it is less than 40 vol %, formation of the thick film resistor is difficult.

With reference to the particle size of respective powders, it is preferred that the average particle size of the metal boride is smaller than that of the glass and that of the metal boride is about in the range of 0.5-3 μm and that of the glass is in the range of 5-6 μm. Regarding the particle size of Co which varies depending upon the range of resistivity of the desired resistor, this may be in the range of 1-5 μm when the CoO powder is used.

Some glasses contain the metallic Co or Co oxide, but according to the investigation of the inventors, as mentioned hereinafter, the object of the present invention cannot be attained by such metallic Co or Co oxide as contained in the glass per se.

As explained above, the thick film resistor composition of the present invention comprises a metal boride, a glass, an organic vehicle, and a metallic cobalt or a crystalline cobalt oxide and the most preferred is a composition prepared by intimately mixing a $LaB_6$ powder as the metal boride, a borosilicate glass as the glass and a CoO power as the crystalline cobalt oxide and adding a given amount of the organic vehicle to the mixture.

When the resistor composition of the present invention is used, since this can be fired in a reducing atmosphere, Cu materials can be used for the conductor circuit and thus, a hybrid IC of a low impedance and small TCR can be provided.

In the present invention, it is preferred to use, as a substrate, a green body such as green sheet which can be fired together with said Cu circuit and resistor in a reducing atmosphere to make an integral body. Examples of materials for the green body include alumina and alumina-borosilicate glass. The green body can be produced by known methods.

Use of the resistor composition of the present invention together with the Cu conductor is suitable and gives a resistor of high accuracy. This is because Co or a crystalline Co compound is added to the composition containing a metal boride and a glass. Thus, when the composition is fired in a reducing atmosphere, Co boride is formed in the grin boundaries of the metal boride particles.

Figure 3:
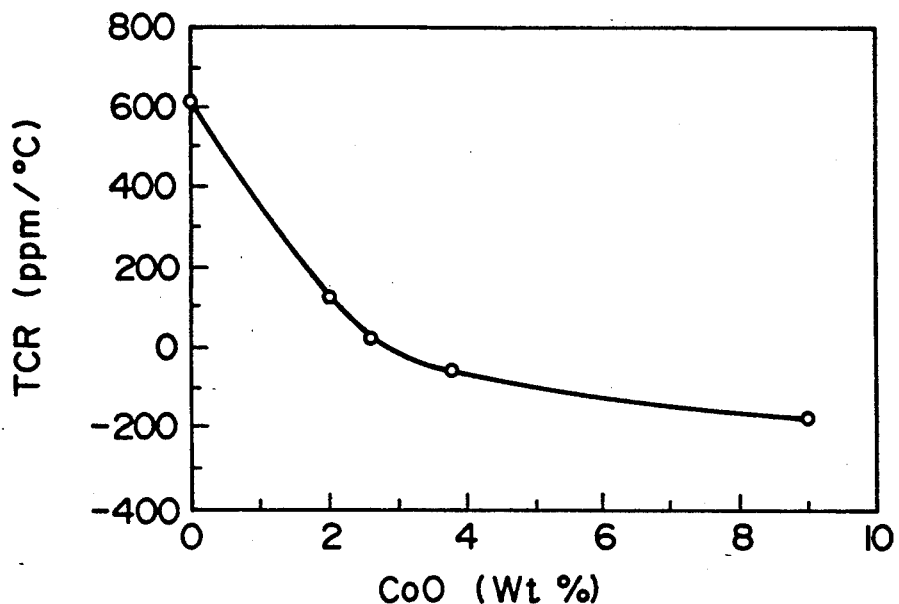
FIG. 3 is a graph which shows a relation between the amount of CoO added and TCR.
Figure 4:
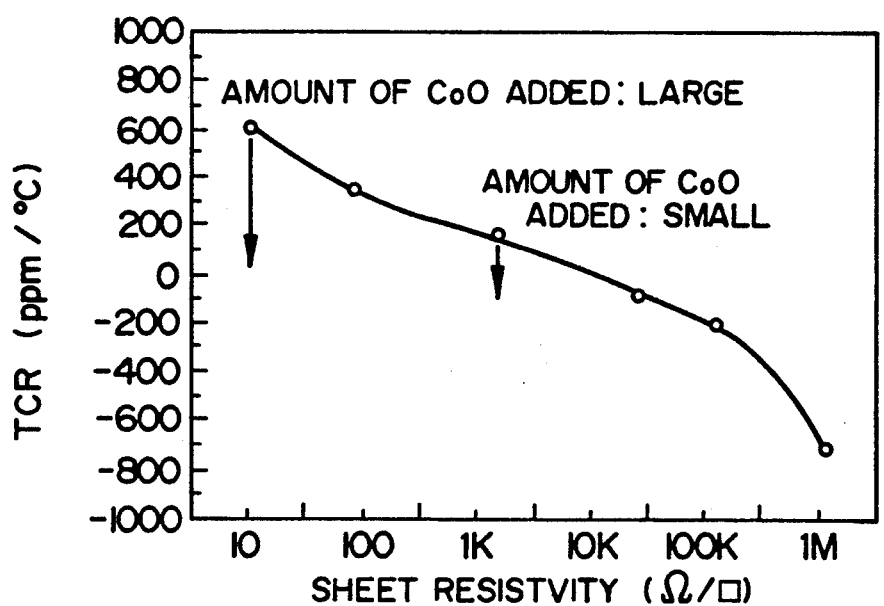
FIG. 4 is a graph which shows a relation between the sheet resistivity and TCR.

The relation between the amount of CoO added and TCR is shown in FIG. 3. This FIG. 3 shows the results of investigation on thick film resistors of Nos. 1-5 in Table 2 which have a sheet resistivity of about 10 Ω/□. It can be clearly seen that TCR decreases with increase in the amount of CoO added. Generally, the thick film resistors have the characteristic that TCR decreases with increase of the sheet resistivity as shown in FIG. 4.

Therefore, the amount of Co added (the amount of the metallic Co or crystalline Co oxide) must be adjusted depending upon the sheet resistivity. That is, when the sheet resistivity is low, the amount of Co added is increased and when the sheet resistivity is high, the amount of Co added is reduced. This is for adjusting the value of TCR to eventually the range within ±100 ppm/°C.

In this way, sintering of the metal boride is accelerated by the production of the above Co boride to form a strong and stable resistor, whereby electrical contact between the metal borides is also improved and variation in the resistivity can be diminished. This is considered because semiconducting properties are imparted to the glass in the vicinity of the metal boride particles and variation in the resistivity is inhibited and thus, TCR is changed from plus to minus and so, the TCR of the resistor can be substantially reduced.

As mentioned above, the resistor composition of the present invention has the advantage that the composition can be integrally fired together with a Cu conductor in a reducing atmosphere to form a resistor of the integral circuit having the Cu conductor circuit, and besides, the TCR of the resulting resistor can be adjusted to ±100 ppm/°C. Therefore, this resistor can be provided as the hybrid IC of high accuracy, such as a matrix circuit and the like required to have a high resistivity accuracy.

EXAMPLE 1

A $LaB_6$ powder (average particle size: 1 μm) as a metal boride, a powder of borosilicate glass No. 1 (average particle size: 5 μm) having the composition as shown in Table 1 and a CoO powder (average particle size: 5 μm) were intimately mixed. To this mixture was added a given amount of an organic vehicle prepared by dissolving 30 g of an acrylic resin in 100 cc of butylcarbitol acetate and these were uniformly mixed to prepare a paste of a resistor composition. Samples of the paste (Nos. 1-6) were prepared by changing the amount of CoO added with keeping the blending ratio of $LaB_6$ and glass No. 1 at constant (1:1 by volume) and the samples of pastes (Nos. 7-9) were prepared by changing the blending ratio of $LaB_6$ and glass No. 1 and adjusting the amount of CoO within given ranges.

TABLE 1

| Glass | SiO$_2$ | B$_2$O$_3$ | Al$_2$O$_3$ | CaO | CoO (Amount of Co) |
|---|---|---|---|---|---|
| No. 1 | 41 | 37 | 12 | 10 | 0 (0) |
| No. 2 | 41 | 37 | 12 | 9 | 1 (0.8) |
| No. 3 | 38 | 37 | 12 | 10 | 3 (2.4) |
| No. 4 | 38 | 37 | 12 | 7 | 6 (4.7) |
| No. 5 | 38 | 31 | 10 | 8 | 13 (10.2) |

(No. 5 was not vitrified.)

A resistor pattern was printed with the above paste using a screen mask of 325 meshes upon an alumina substrate on which a Cu conductor circuit had been formed. This was fired by heating to 900° C. in a belt furnace in a nitrogen gas atmosphere of 10 ppm in oxygen concentration. The reason for an amount of oxygen being contained in the nitrogen gas atmosphere, namely, non-oxidizing atmosphere here is to improve the solder wettability of the Cu conductor circuit.

The characteristics of the resistor after fired are shown in Table 2.

TABLE 2

| Sample No. | Composition of resistor (g) | | | Resistance characteristics | | | |
|---|---|---|---|---|---|---|---|
| | LaB$_6$ | Glass (No. 1) | CoO | Sheet resistivity ($\Omega/\square$) | TCR (ppm/°C.) | Scattering in resistivity ($\sigma/R$) | Current noise (dB) |
| 1 | 2.02 | 0.98 | 0 | 15.0 | +620 | 0.13 | −24 |
| 2 | 2.02 | 0.98 | 0.06 | 9.6 | +123 | 0.15 | −23 |
| 3 | 2.02 | 0.98 | 0.08 | 8.7 | +22 | 0.18 | −25 |
| 4 | 2.02 | 0.98 | 0.12 | 10.3 | −57 | 0.12 | −26 |
| 5 | 2.02 | 0.98 | 0.30 | 29.6 | −174 | 0.13 | −24 |
| 6 | 2.02 | 0.98 | 0.60 | 35.2 | −813 | 0.13 | −24 |
| 7 | 1.73 | 1.27 | 0.06 | 208.7 | +42 | 0.11 | −24 |
| 8 | 1.40 | 1.60 | 0.04 | 1.63k | −57 | 0.15 | −26 |
| 9 | 1.02 | 1.98 | 0.02 | 29.6k | −24 | 0.14 | −24 |

($\sigma$: Standard deviation R: Average value of sheet resistivity)

As is clear from the above table, the TCR of a thick film resistor having a resistivity of 8.7 $\Omega/\square$−29.6 k $\Omega/58$ can be markedly reduced by adding a given amount of CoO.

COMPARATIVE EXAMPLE 1

Comparison was made on resistor compositions obtained by using glass Nos. 2–4 which contained CoO as shown in Table 1. These glasses used were prepared by mixing respective oxides, leaving the mixture for 1 hour at 1500° C., then rapidly cooling the mixture by introducing it into water to make cullets, and grinding the cullets by a crusher and then by a ball mill to give powders of 5 μm in average particle size.

This glass was combined with LaB$_6$ at the ratio shown in Table 3 and resistors were made in the same manner as in Example 1. The resistance characteristics of these resistors are shown in Table 3.

TABLE 3

| Sample No. | Composition of resistor (g) | | | | | Resistance characteristics | | | |
|---|---|---|---|---|---|---|---|---|---|
| | Metal boride LaB$_6$ | Glass No. 1 | No. 2 | No. 3 | No. 4 | Sheet resistivity ($\Omega/\square$) | TCR (ppm/°C.) | Scattering in resistivity ($\sigma/R$) | Current noise (dB) |
| 10 | 2.00 | — | 1.00 | — | — | 13.6 | +523 | 0.15 | −23 |
| 11 | 2.01 | — | — | 0.99 | — | 14.0 | +530 | 0.14 | −24 |
| 12 | 1.01 | — | — | — | 1.10 | 9.8 | +490 | 0.15 | −23 |

($\sigma$: Standard deviation R: Average value of sheet resistivity)

As is clear from Table 3, when CoO was contained in the glass and added in such form, TCR cannot be reduced. This is because CoO in the glass is present in an amorphous state. Therefore, CoO must be contained as crystal in the resistor.

However, even when a glass containing CoO is used, the same effects as in Example 1 are obtained if metallic Co or a crystalline Co oxide is separately added in a necessary amount as in Example 1.

EXAMPLE 2

Resistor compositions were prepared using metal borides and metallic Co and Co oxides as shown in Tables 4 and 5. As glass, the glass (No. 1) as shown in the above Table 1 was used.

The metal boride and the glass were blended at a ratio of about 1:1 by volume.

Resistors were prepared using the above resistor compositions and the resistance characteristics were measured in the same manner as in Example 1. The results are shown in Tables 4 and 5.

TABLE 4

| Sample No. | Composition of resistor (g) | | | | | Resistance characteristics | | | |
|---|---|---|---|---|---|---|---|---|---|
| | Metal boride | Glass (No. 1) | Co | CoO | Co$_3$O$_4$ | Sheet resistivity ($\Omega/\square$) | TCR (ppm/°C.) | Scattering in resistivity ($\sigma/R$) | Current noise (dB) |
| 13 | TiB$_2$ | 1.0 | — | — | — | 15.1 | +620 | 0.13 | −24 |
| 14 | " | 1.0 | 0.15 | — | — | 11.1 | +40 | 0.14 | −19 |
| 15 | " | 1.0 | 0.05 | — | 0.10 | 12.0 | +61 | 0.12 | −18 |
| 16 | ZrB$_2$ | 1.1 | — | — | — | 25.5 | +540 | 0.12 | −26 |
| 17 | " | 1.0 | — | — | 0.16 | 16.3 | +18 | 0.10 | −24 |
| 18 | TaB$_2$ | 1.3 | — | — | — | 9.0 | +820 | 0.12 | −26 |
| 19 | " | 1.3 | — | 0.15 | — | 9.4 | +22 | 0.11 | −21 |
| 20 | " | 1.3 | 0.10 | 0.05 | — | 10.5 | +35 | 0.12 | −23 |

(Amount of metal boride: 2g $\sigma$: Standard deviation R: Average value of sheet resistivity)

TABLE 5

| Sample No. | Composition of resistor (g) | | | | | Resistance characteristics | | | |
|---|---|---|---|---|---|---|---|---|---|
| | Metal boride | Glass (No. 1) | Co | CoO | Co$_3$O$_4$ | Sheet resistivity ($\Omega/\square$) | TCR (ppm/°C.) | Scattering in resistivity ($\sigma/R$) | Current noise (dB) |
| 21 | MoB | 1.2 | — | — | — | 15.0 | +645 | 0.13 | −24 |
| 22 | " | 1.2 | 0.20 | — | — | 16.1 | +35 | 0.11 | −29 |
| 23 | " | 1.2 | 0.10 | 0.15 | — | 26.1 | +64 | 0.15 | −21 |
| 24 | WB | 1.2 | — | — | — | 31.2 | +670 | 0.13 | −24 |

TABLE 5-continued

| Sample No. | Composition of resistor (g) | | | | | Resistance characteristics | | | |
|---|---|---|---|---|---|---|---|---|---|
| | Metal boride LaB$_6$ | Glass (No. 1) | Co | CoO | Co$_3$O$_4$ | Sheet resistivity (Ω/□) | TCR (ppm/°C.) | Scattering in resistivity (σ/R) | Current noise (dB) |
| 25 | " | 1.2 | 0.15 | — | — | 15.0 | +20 | 0.13 | −26 |
| 26 | FeB | 1.1 | — | — | — | 45.2 | +530 | 0.11 | −21 |
| 27 | " | 1.1 | 0.07 | 0.09 | — | 12.0 | +16 | 0.13 | −24 |
| 28 | NiB | 1.0 | — | — | — | 12.0 | +680 | 0.12 | −19 |
| 29 | " | 1.0 | — | 0.14 | — | 11.0 | +55 | 0.12 | −19 |

(Amount of metal boride: 2 g σ: Standard deviation R: Average value of sheet resistivity)

As is clear from Tables 4 and 5, in the case of the samples to which metallic Co or a Co oxide was added, the TCR of the resistors could be much reduced.

EXAMPLE 3

Resistors of resistor matrix circuits necessary for separation of stereo sound and reproduction of color of video amplifiers are required to be highly accurate.

For example, a relation between a degree of separation of stereo sound and an accuracy of resistivity is expressed by the following formula (I):

$$S = 20 \log \frac{1 + \alpha}{1 - \alpha} \text{ (dB)} \quad (I)$$

where S denotes a degree of separation of sound and α denotes an accuracy or resistivity.

The degree of separation of left and right sounds is required to be generally 40 dB or higher. When the accuracy of resistivity is −1%, α=0.99 and S is 46 dB. Therefore, in order that the degree of separation is 40 dB or higher, the accuracy of resistivity must be within ±1% and naturally, TCR must be within ±100 ppm/°C.

In resistor matrix circuits which process the stereo sound, the accuracy of resistivity of respective resistors must be within ±1% for attaining the above-mentioned degree of separation of sound.

Therefore, the resistors were prepared using the composition corresponding to those of the present invention among the resistor compositions shown in Table 2 and, as a result, those of a high degree of separation of sound were obtained.

It was recognized that when the compositions of the present invention were applied to resistors of resistor matrix circuits, the resulting resistors were high in degree of separation of sound and in accuracy in resistivity.

FIG. 1 shows a part of the circuit pattern of hybrid IC made from the above matrix circuit. According to the present invention, the Cu conductor can be used.

EXAMPLE 4

This is an example where the resistor compositions of the present invention were applied to a resistor for the inner layer of a multilayer hybrid IC having a conductor circuit of Cu and fired at a low temperature.

Figure 2:
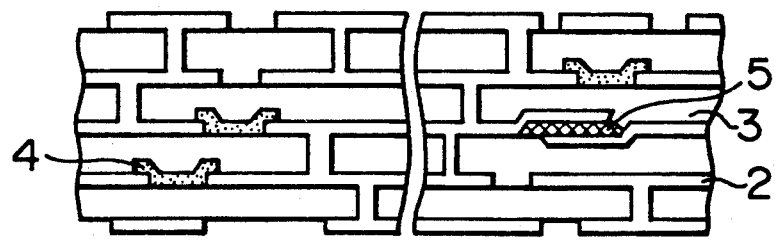
FIG. 2 shows a partial cross-sectional view of a three-dimensional multilayer hybrid IC.

FIG. 2 is a partial cross-sectional view of the above active filter.

Through-holes were made through a green sheet comprising alumina-borosilicate glass and a Cu conductor circuit was printed. A resistor was formed by printing thereon. In this example, resistor compositions Nos. 4, 7, 8 and 9 in Table 2 were used as resistors in order that the resistivity thereof after fired was 30 Ψ/□ − 10 k Ω/□. The packaged multilayer boards were fired at 900° C. as in Example 1.

The TCR of these resistors was within ±100 ppm/°C. and active filters of high accuracy were obtained.

What is claimed is:

1. A thick film resistor composition comprising a metal boride, a glass and an organic vehicle which contains at least one of metallic cobalt and a cobalt oxide in an amount of 0.1–10 parts by weight in terms of cobalt per 100 parts by weight of the mixture of the metal boride and the glass.

2. The thick film resistor composition according to claim 1, wherein the mixture of metal boride and glass comprises 40–95 vol % of glass and the remainder of the metal boride.

3. The thick film resistor composition according to claim 1, wherein the metal boride has an average particle size of 0.5–3 μm, the glass has an average particle size of 5–6 μm, and the cobalt oxide has an average particle size of 1–5 μm.

4. The thick film resistor composition according to claim 1, wherein the glass is borosilicate glass.

5. A thick film resistor composition which contains a boride of at least one element selected from the group consisting of rare earth elements, Group IV elements, Group V elements, Group VI elements and Group VIII elements, a glass, at least one of metallic cobalt and a cobalt oxide in an amount of 0.1–10 parts by weight in terms of cobalt per 100 parts by weight of the mixture of the boride and the glass, and an organic vehicle.

6. The thick film resistor composition according to claim 5, wherein the mixture of boride and glass comprises 40–95 vol % of the glass and the remainder of the metal boride.

7. The thick film resistor composition according to claim 5, wherein the boride has an average particle size of 0.5–3 μm, the glass has an average particle size of 5–6 μm, and the cobalt oxide has an average particle size of 1–5 μm.

8. The thick film resistor composition according to claim 5, wherein the glass is borosilicate glass.

9. The thick film resistor composition according to claim 5, wherein the organic vehicle is butylcarbitol acetate in which acrylic resin as dissolved.

10. A hybrid IC which comprises a substrate having thereon a copper conductor circuit and a thick film resistor formed in contact with the conductor circuit, wherein the thick film resistor is a sintered body of a composition comprising 100 parts by weight of a mixture of a metal boride and a glass and at least one of metallic cobalt and a cobalt oxide in an amount of 0.1–10 parts by weight in terms of cobalt.

11. The hybrid IC according to claim 10, wherein the mixture of metal boride and glass in the thick film resistor comprises 40-95 vol % of glass and the remainder of the metal boride.

12. The hybrid IC according to claim 10, wherein in the thick film resistor the metal boride has an average particle size of 0.5-3 μm, the glass has an average particle size of 5-6 μm, and the cobalt oxide has an average particle size of 1-5 μm.

13. The hybrid IC according to claim 10, wherein the glass in the thick film resistor is borosilicate glass.

14. A hybrid IC which comprises a substrate having thereon a copper conductor circuit and a thick film resistor formed in contact with the conductor circuit wherein the thick film resistor is a sintered body of a composition comprising a boride of at least one element selected from the group consisting of rare earth elements, Group IV elements, Group V elements, Group VI elements and Group VIII elements, a glass, at least one of metallic cobalt and a cobalt oxide in an amount of 0.1-10 parts by weight in terms of cobalt per 100 parts by weight of the mixture of the boride and the glass, and an organic vehicle.

15. The hybrid IC according to claim 14, wherein the mixture of boride and glass in the thick film resistor comprises 40-95 vol % of the glass ad the remainder of the metal boride.

16. The hybrid IC according to claim 14, wherein in the thick film resistor, the boride has an average particle size of 0.5-3 μm, the glass has an average particle size of 5-6 μm, and the cobalt oxide has an average particle size of 1-5 μm.

17. The hybrid IC according to claim 14, wherein the glass in the thick film resistor is borosilicate glass.

18. The thick film resistor composition according to claim 2, wherein the metal boride has an average particle size of 0.5-3 μm, the glass has an average particle size of 5-6 μm and the cobalt oxide has an average particle size of 1-5 μm.

19. The thick film resistor composition according to claim 6, wherein the boride has an average particle size of 0.5-3 μm, the glass has an average particle size of 5-6 μm and the cobalt oxide has an average particle size of 1-5 μm.

20. The hybrid IC according to claim 11, wherein in the thick film resistor, the metal boride has an average particle size of 0.5-3 μm, the glass has an average particle size of 5-6 μm and the cobalt oxide has an average particle size of 1-5 μm.

21. The hybrid IC according to claim 15, wherein the thick film resistor, the boride has an average particle size of 0.5-3 μm, the glass has an average particle size of 5-6 μm and the cobalt oxide has an average particle size of 1-5 μm.

22. The thick film resistor composition according to claim 1, wherein the metal boride is selected from the group consisting of $LaB_6$, $TiB_2$, $ZrB_2$, $TaB_2$, MoB, WB, FeB, NiB, $HfB_2$ and $NbB_2$.

23. The hybrid IC according to claim 10, wherein the metal boride is selected from the group consisting of $LaB_6$, $TiB_2$, $ZrB_2$, $TaB_2$, MoB, WB, FeB, NiB, $HfB_2$ and $NbB_2$.

* * * * *